United States Patent
Lee et al.

(10) Patent No.: US 9,837,179 B2
(45) Date of Patent: Dec. 5, 2017

(54) ELECTRICALLY CONDUCTIVE THIN FILMS

(71) Applicant: SAMSUNG ELECTRONICS CO., LTD., Suwon-si, Gyeonggi-do (KR)

(72) Inventors: Kimoon Lee, Seoul (KR); Sang Il Kim, Seoul (KR); Se Yun Kim, Seoul (KR); Sung Woo Hwang, Seoul (KR); Woojin Lee, Suwon-si (KR); Hee Jung Park, Daejeon (KR); Yoon Chul Son, Hwaseong-si (KR); Hyosug Lee, Suwon-si (KR); Doh Won Jung, Seoul (KR); Youngjin Cho, Suwon-si (KR); Jae-Young Choi, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 52 days.

(21) Appl. No.: 14/940,223

(22) Filed: Nov. 13, 2015

(65) Prior Publication Data
US 2016/0141067 A1    May 19, 2016

(30) Foreign Application Priority Data
Nov. 14, 2014  (KR) .......................... 10-2014-0158848

(51) Int. Cl.
*H01B 1/02*  (2006.01)
*H01B 1/06*  (2006.01)
(Continued)

(52) U.S. Cl.
CPC ............. *H01B 1/02* (2013.01); *C01B 19/002* (2013.01); *C01B 19/007* (2013.01); *C30B 7/00* (2013.01);
(Continued)

(58) Field of Classification Search
None
See application file for complete search history.

(56) References Cited

U.S. PATENT DOCUMENTS

| | | | |
|---|---|---|---|
| 2010/0132770 A1* | 6/2010 | Beatty | H01L 51/426 136/252 |
| 2012/0058597 A1* | 3/2012 | Anthopoulos | H01L 29/78681 438/104 |
| 2012/0204950 A1* | 8/2012 | Magdassi | C23C 4/18 136/256 |

(Continued)

FOREIGN PATENT DOCUMENTS

| | | |
|---|---|---|
| JP | 05-062680 A | 3/1993 |
| JP | 2003-012327 A | 1/2003 |

OTHER PUBLICATIONS

Lee et al., "Dicalcium nitride as a two-dimensional electride with an anionic electron layer", Nature, vol. 494, Feb. 21, 2013, pp. 336-341.
(Continued)

*Primary Examiner* — Katie L Hammer
(74) *Attorney, Agent, or Firm* — Cantor Colburn LLP

(57) ABSTRACT

An electrically conductive thin film including: a material including a compound represented by Chemical Formula 1 and having a layered crystal structure, $$Me_mA_a \qquad \text{Chemical Formula 1}$$

wherein Me is Al, Ga, In, Si, Ge, Sn, A is S, Se, Te, or a combination thereof, and m and a each are independently a number selected so that the compound of Chemical Formula 1 is neutral; and
a dopant disposed in the compound of Chemical Formula 1, wherein the dopant is a metal dopant that is different from Me and has an oxidation state which is greater than an oxidation state of Me, a non-metal dopant having a greater number of valence electrons than a number of valence electrons of A in Chemical Formula 1, or a combination thereof, and wherein the compound of Chemical Formula 1 includes a chemical bond which includes a valence electron of an s orbital of Me.

20 Claims, 6 Drawing Sheets

(51) Int. Cl.
    *C30B 29/60*     (2006.01)
    *C30B 7/00*     (2006.01)
    *C01B 19/00*     (2006.01)
    C30B 29/46     (2006.01)
    H01L 21/02     (2006.01)

(52) U.S. Cl.
    CPC ............ *C30B 29/60* (2013.01); *C30B 29/605* (2013.01); *C30B 29/607* (2013.01); *H01B 1/06* (2013.01); *C01P 2002/20* (2013.01); *C01P 2002/30* (2013.01); *C01P 2002/90* (2013.01); *C30B 29/46* (2013.01); *H01L 21/02417* (2013.01); *H01L 21/02573* (2013.01); *H01L 21/02609* (2013.01)

(56) References Cited

U.S. PATENT DOCUMENTS

2012/0329686 A1* 12/2012 Tenne .................... B82Y 30/00
                                                                                  508/150
2013/0302593 A1* 11/2013 Coleman ................ C01G 35/00
                                                                                  428/323

OTHER PUBLICATIONS

Pan et al., "Field effect transistors with layered two-dimensional SnS2-xSex conduction channels: Effects of selenium substitution", Applied Physics Letters, vol. 103, 2013, 093108-1-093108-5.
Wang et al., "Electronics and potoelectronics of two-dimensional transition metal dichalcogenides", Nature Nanotechnology, vol. 7, Nov. 2012, pp. 699-712.

* cited by examiner

ELECTRICALLY CONDUCTIVE THIN FILMS

CROSS-REFERENCE TO RELATED APPLICATION

This application claims priority to and the benefit of Korean Patent Application No. 10-2014-0158848, filed in the Korean Intellectual Property Office on Nov. 14, 2014, and all the benefits accruing therefrom under 35 U.S.C. §119, the entire content of which is incorporated herein by reference.

BACKGROUND

1. Field

The present disclosure relates to an electrically conductive thin film and an electronic device including the same.

2. Description of the Related Art

An electronic device, such as an LCD or LED flat panel display, a touch screen panel, a solar cell, a transparent transistor, and the like may include an electrically conductive film or transparent electrically conductive film. It is desirable for a material of an electrically conductive film to have high light transmittance, e.g., a light transmittance of greater than or equal to about 80% in a visible light region, and low specific resistance, e.g., less than or equal to about $1\times10^{-4}$ $\Omega$*cm. Currently available oxide materials for electrically conductive films include indium tin oxide (ITO), tin oxide ($SnO_2$), zinc oxide (ZnO), and the like. ITO is a transparent electrode material and is a degenerate semiconductor having a bandgap of 3.75 eV and may be manufactured to have a large area using a sputtering process. However, in terms of application to a flexible touch panel or a UD-grade high resolution display, ITO materials have poor flexibility and inevitably will have undesirably high cost due to limited reserves of indium, and thus there have been many attempts to identify an alternative to ITO.

Recently, a flexible electronic device, such as a bendable or foldable device, has been drawing attention as a next generation electronic device. Therefore, there remains a need for a material having transparency, relatively high electrical conductivity, and flexibility, as well as transparent materials suitable for transparent electrode materials.

SUMMARY

An embodiment provides an electrically conductive thin film with high electrical conductivity and high light transmittance, and/or excellent flexibility.

Another embodiment provides an electronic device including the electrically conductive thin film.

In an embodiment, an electrically conductive thin film includes: a compound represented by the following Chemical Formula 1 and having a layered crystal structure:

   Chemical Formula 1 wherein Me is Al, Ga, In, Si, Ge, Sn, or a combination thereof, A is S, Se, Te, or a combination thereof, and m and a are each independently a number so that the compound of Chemical Formula 1 is neutral; and a dopant disposed in the compound of Chemical Formula 1, wherein the dopant is a metal dopant that is different from Me and has an oxidation state of Me, a non-metal dopant having a greater number of valence electrons than a number of valence electrons of A in Chemical Formula 1, or a combination thereof, wherein the compound of Chemical Formula 1 comprises a chemical bond which comprises a valence electron of an s orbital of Me.

The metal dopant may include Ti, Zr, Hf, V, Nb, Ta, Cr, Mo, W, Mn, Fe, Ru, Co, Si, Ge, Sn, or a combination thereof.

The non-metal dopant may be F, Cl, Br, I, or a combination thereof.

The compound may include $SnS_2$, $SnSe_2$, GaS, GaSe, InSe, $SiS_2$, $GeS_2$, $GeSe_2$, $Al_2Te_3$, or a combination thereof.

The content of the metal dopant may be less than or equal to about 10 atomic percent (atomic %), relative to a content of Me.

The content of the non-metal dopant may be less than or equal to about atomic %, relative to a content of A.

The electrically conductive thin film may include a plurality of nanosheets including the compound, and the nanosheets may contact each other so as to provide an electrical connection.

The electrically conductive thin film may be a continuous deposition film including the compound.

The electrically conductive thin film may have a thickness of less than or equal to about 100 nm.

The compound may have electron mobility of greater than or equal to about 31 $cm^2/Vs$ in a doped state.

The compound may be doped to be an n-type conductor.

The electrically conductive thin film may include a polycrystalline material of the doped material of Chemical Formula 1.

Another embodiment provides an electronic device including the electrically conductive thin film.

The electronic device may be a flat panel display, a touch screen panel, a solar cell, an e-window, an electrochromic mirror, a heat mirror, a transparent transistor, or a flexible display.

Also disclosed is a method manufacturing an electrically conductive thin film, the method including: providing a compound represented by Chemical Formula 1 and having a layered crystal structure:

   Chemical Formula 1 wherein Me is Al, Ga, In, Si, Ge, and Sn, or a combination thereof, A is S, Se, or Te, or a combination thereof, and m and a are each independently a number selected so that the compound of Chemical Formula 1 is neutral; and disposing a dopant in the compound of Chemical Formula 1, wherein the dopant is a metal dopant that is different from Me and has an oxidation state which is greater than an oxidation state of Me, a non-metal dopant having a greater number of valence electrons than a number of valence electrons of A in Chemical Formula 1, or a combination thereof to manufacture the electrically conductive thin film.

In the disclosed thin film, the doped material has a conduction path based on two dimensional overlapping of the s orbitals and thereby may provide enhanced electron mobility and improved electron density. In addition, the doped compound may have a relatively high level of chemical and oxidative stability. As the doped compound has a layered structure, it may provide significantly enhanced flexibility. Therefore, an electrically conductive thin film including the doped material can be used to provide a transparent electrode in next generation flexible electronic devices.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
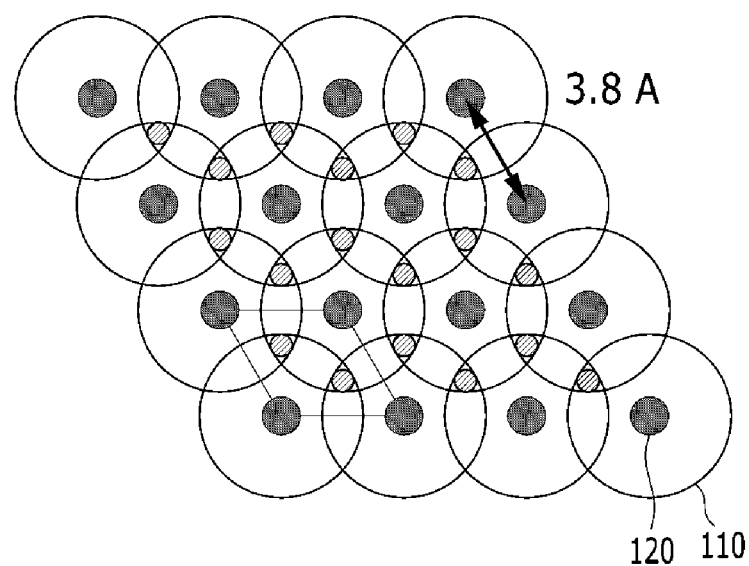
FIG. 1 is a top view schematically illustrating an embodiment of an s orbital overlap and electron arrangement of $Sn^{4+}$ ions in $SnSe_2$.

Exemplary embodiments will now be described more fully with reference to the accompanying drawings, in which some exemplary embodiments are shown. The exemplary embodiments, may, however, be embodied in many different forms and should not be construed as being limited to the embodiments set forth herein; rather, these exemplary embodiments are provided so that this disclosure will be thorough and complete, and will fully convey the scope of the exemplary embodiments of inventive concepts to those of ordinary skill in the art. Therefore, in some exemplary embodiments, well-known process technologies may not be explained in detail in order to avoid unnecessarily obscuring of aspects of the exemplary embodiments. If not defined otherwise, all terms (including technical and scientific terms) in the specification may be defined as commonly understood by one skilled in the art. The terms defined in a generally-used dictionary are not to be interpreted ideally or exaggeratedly unless clearly defined. In addition, unless explicitly described to the contrary, the word "comprise" and variations such as "comprises" or "comprising" will be understood to imply the inclusion of stated elements but not the exclusion of any other elements.

Further, the singular includes the plural unless mentioned otherwise.

In the drawings, the thickness of layers, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, the term "metal" refers to a metal and a semi-metal.

As used herein, the term "dopant" refers to an atom that occupies a site of an atom in a crystal lattice of a material in which the dopant is disposed. In this case, the doped material has substantially the same crystalline phase as the crystalline phase thereof prior to being doped when analyzed by X-ray diffraction.

In an embodiment, an electrically conductive thin film includes a material comprising a compound represented by the following Chemical Formula 1 and having a layered crystal structure, wherein the compound of Chemical Formula 1 comprises a chemical bond which comprises a valence electron of an s orbital of Me:

$Me_mA_a$  Chemical Formula 1 wherein m and a are each independently a number selected so that the compound Chemical Formula 1 is neutral; and a dopant disposed in the compound of Chemical Formula 1, wherein the dopant is a metal dopant that is different from the Me and has a higher oxidation state than that of Me, a non-metal dopant having a greater number of valence electrons than that of A in Chemical Formula 1, or a combination thereof, wherein Me is Al, Ga, In, Si, Ge, Sn, or combination thereof, and A is S, Se, Te, or combination thereof.

In an embodiment, the compound according to Chemical Formula 1 may include $SnS_2$, $SnSe_2$, $GaS$, $GaSe$, $InSe$, $SiS_2$, $GeS_2$, $GeSe_2$, $Al_2Te_3$, or a combination thereof.

The compound according to Chemical Formula 1 comprises a metal dopant that is different from the Me and has an oxidation state which is greater than that of Me, a non-metal dopant having a greater number of valence electrons than that of A, or a combination thereof.

In the compound according to Chemical Formula 1, a valence electron of the cation metal (Me) is present in an s orbital. In the compound according to Chemical Formula 1, the distance between nuclei of adjacent cation metals (Me) is relatively short, e.g., about 2.5 angstroms (Å) to about 4.5 Å, and the s orbitals of the adjacent cation metals (Me) have a large spatial size, e.g., about 5 Å to about 7.5 Å, so as to be effectively overlapped to each other.

Accordingly, the material may have a conductive path formed by the overlapping of the s orbitals. As the compounds have a layered crystal structure, the s orbital-overlapped conductive path may be two-dimensionally confined. When being compared with the d orbital overlap, the two-dimensionally confined s orbital-overlapped conductive path has less disturbance (e.g., electron scattering), and thus may provide improved electron mobility.

Figure 2:
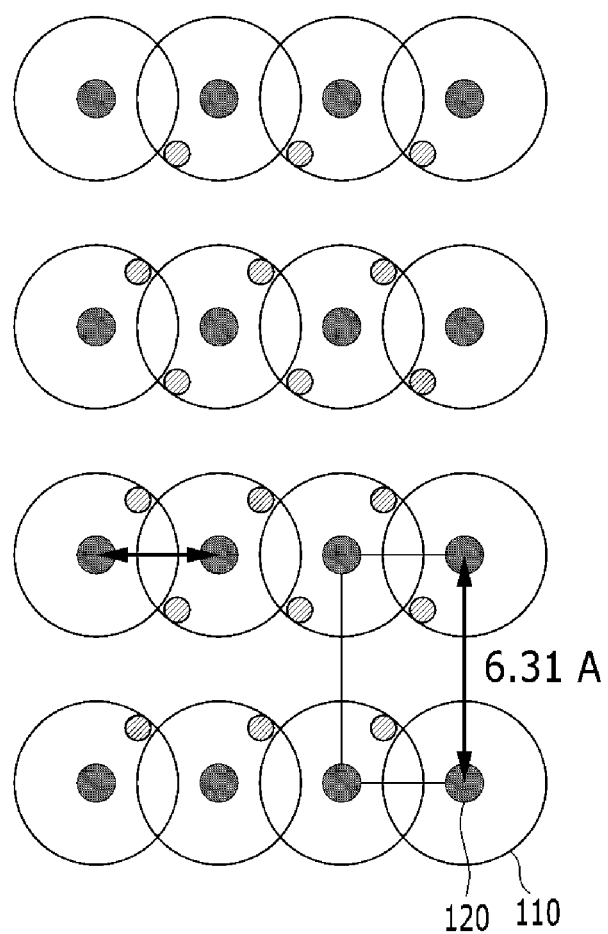
FIG. 2 is a side view schematically illustrating an embodiment of s orbital overlap and an electron arrangement of $Sn^{4+}$ ions in $SnSe_2$.

FIG. 1 and FIG. 2 show an embodiment of the electronic structure of the compound of Chemical Formula 1, e.g., $SnSe_2$. The valence electron in $SnSe_2$ is present in a $5s^1$ orbital 110, and the distance between Me nuclei 120 (e.g., $Sn^{4+}$) is short (e.g., about 2.5 angstroms (Å) to about 4.5 Å, e.g., about 3.8 Å), and while not wanting to be bound by theory, it is believed that the 5s orbitals may be overlapped as shown in FIG. 1. In addition, because $SnSe_2$ has a layered crystal structure, the valence electrons present in the widely spread 5s orbital of $Sn^{4+}$ may be confined in two dimensions and transferred. In other words, the electron-transfer path in the compound according to Chemical Formula 1 may be confined to a plane formed by the overlapping s orbitals. Further, as shown in FIG. 2, the gap between the adjacent layers is about 5 Å to about 8 Å, or about 6.31 Å, and is much longer than the distance between nuclei (e.g., 3.8 Å). Therefore, the s orbital overlap between the layers may be negligible. Therefore, the valence electrons may exhibit much improved mobility in the compound according to Chemical Formula 1 in comparison with other compounds.

In the compound according to Chemical Formula 1, the improved electron mobility may lead to significantly improved electrical conductivity when it is combined with a high electron concentration by doping the compound according to Chemical Formula 1 with a metal dopant, a non-metal dopant, or a combination thereof. Such an improvement in electrical conductivity may be much more than the electrical conductivity of a doped semiconductor material. Unlike the doped semiconductor material, the doped material which comprises the compound according to Chemical Formula 1 and the dopant, as mentioned above, may provide increased electron mobility together with greater electron concentration. The metal dopant (e.g., a metal cation) may include Ti, Zr, Hf, V, Nb, Ta, Cr, Mo, W, Mn, Fe, Ru, Co, Al, Ga, In, or a combination thereof. The non-metal dopant (e.g., a non-metal anion) may be F, Cl, Br, I, or a combination thereof. Use of Cl as a dopant is specifically mentioned. The compound may be doped to be an n-type compound. The content of the metal dopant may be less than or equal to about 10 atomic %, less than or equal to about 9 atomic %, less than or equal to about 8 atomic %, less than or equal to about 7 atomic %, less than or equal to about 6 atomic %, less than or equal to about 5 atomic %, less than or equal to about 4 atomic %, less than or equal to about 3 atomic %, less than or equal to about 2 atomic %, less than or equal to about 1 atomic %, less than or equal to about 0.5 atomic %, less than or equal to about 0.4 atomic %, or less than or equal to about 0.3 atomic %, or about 0.01 atomic % to about 10 atomic %, or about 0.05 atomic % to about 8 atomic %, relative to the content of the metal element Me, and may be different depending on the type of the metal dopant and the type of the metal and the non-metal of the compound according to Chemical Formula 1. The content of the non-metal dopant may be less than or equal to about 10 atomic %, less than or equal to about 9 atomic %, less than or equal to about 8 atomic %, less than or equal to about 7 atomic %, less than or equal to about 6 atomic %, 5 atomic %, less than or equal to about 4 atomic %, less than or equal to about 3 atomic %, less than or equal to about 2 atomic %, less than or equal to about 1 atomic %, less than or equal to about 0.5 atomic %, less than or equal to about 0.4 atomic %, or less than or equal to about 0.3 atomic %, or about 0.01 atomic % to about 10 atomic %, or about 0.05 atomic % to about 8 atomic %, relative to the content of the non-metal element A, and may be different depending on the type of the non-metal dopant and the type of the metal and non-metal of the compound of Chemical Formula 1. The doped material provides significantly improved electron mobility, for example, about 2 times or greater, about 3 times or greater, about 4 times or greater, or about 5 times or greater, or about 1.5 times to about 50 times an electron mobility of the compound according to Chemical Formula 1 prior to its being doped (even when the doping concentration is low, for example, about 0.2 atomic %). The doped material also provides significantly improved electron concentration, for example, about 2 times or greater, about 5 times or greater, about 10 times or greater, about 15 times or greater, about 20 times or greater, about 25 times or greater, or even about 30 times greater, or about 1.5 times to about 1000 times an electron concentration of the compound according to Chemical Formula 1 prior to its being doped. An electron mobility of the doped material may be about 35 square centimeters per volts-seconds (cm$^2$Ns) to about 100 cm$^2$/Vs, e.g., about 40 cm$^2$/Vs to about 90 cm$^2$/Vs, or about 45 cm$^2$/Vs to about 80 cm$^2$/Vs. As a result, the doped material may provide a significantly enhanced electrical conductivity that is at least about 10 times, for example, at least about times, at least about 30 times, at least about 40 times, at least about 50 times, at least about 60 times, at least about 70 times, at least about 80 times, at least about 90 times, even at least about 100 times, at least about 200 times, or greater than or equal to about 300 times, or about 2 times to about 1000 times greater than a conductivity of the compound according to Chemical Formula 1 prior to its being doped. The electrical conductivity of the doped material may be about 10 Siemens per centimeter to about 1000 Siemens per centimeter, about 20 Siemens per centimeter to about 800 Siemens per centimeter, or about 30 Siemens per centimeter to about 600 Siemens per centimeter. Also, the doped material, when in the form of a film, may have a sheet resistance of about 30 ohms per square (Ω/sq) to about 400 ohms per square, about 60 ohms per square to about 350 ohms per square, or about 90 ohms per square to about 300 ohms per square. While having the foregoing properties, the doped material may have a transmittance for visible light, e.g., light having a wavelength of 400 nm to 700 nm, of 80% to 99.9%, 85% to 99%, or 90% to 95%.

Together with the improved conductivity, the compound according to Chemical Formula 1, which is a type of a semiconductor material, may exhibit high light transmittance. Accordingly, the electrically conductive thin film including the doped material may be used in applications which benefit conductivity and high transparency (e.g., a transparent electrode). Various efforts have been performed to develop a flexible transparent electrode material having high electrical conductivity and high transparency in the visible light region. For example, metals may have a high electron density and high electrical conductivity. However, most metals easily react with oxygen in the air to form an oxide at its surface, and this leads to a significant decrease in its conductivity. It has been attempted to decrease surface contact resistance by using a ceramic material having good electrical conductivity and decreased surface oxidation. However, currently available conductive ceramic materials (such as ITO) have difficulties of an unstable supply of raw materials. Moreover, such conductive ceramic materials may not provide suitable electrical conductivity, such as an electrical conductivity comparable to that of a metal, and their flexibility tends to be poor. Since a layered material of graphene has desirable conductivity characteristics, significant effort has been made to provide a monoatomic thin film comprising a material having a layered structure and having a weak interlayer bonding forces. In particular, many efforts have been performed to apply graphene to provide a highly a flexible conductive film material by substituting graphene for indium tin oxide (ITO), which has poor mechanical properties. However, due to its high absorption coefficient (a), the graphene does not provide satisfactory transmittance and thus it cannot be used to provide a suitable film having a thickness of greater than or equal to 4 atomic layers of graphene. In addition, because graphene can have an unfavorable defect level, it is difficult in practice to provide the high theoretical electrical conductivity of graphene. On the other hand, most transition metal dichalcogenides (TMDC), which are known to have a layered crystal structure, may provide satisfactory transmittance, but the conductivity of such transition metal dichalcogenides is around that of a semiconductor, so it is difficult to apply transition metal dichalcogenides to provide a transparent conductive layer.

On the contrary, the disclosed conductive layer including the doped compound may provide improved electrical conductivity and provide high light transmittance, e.g., a light transmittance like that of the semiconductor material. For example, in some transition metal dichalcogenides, electrical conduction may occur through a d-orbital, which may have high electron-ion scattering or electron-electron scattering. Unlike the transition metal dichalcogenides, the doped material has an s-orbital overlapped conduction pathway, which is understood to provide further improved electrical conductivity. The doped material may have improved stability compared to an electrode material that has electrons as anions in its two-dimensionally layered structure. For example, the doped material may maintain the desired physical properties even when being allowed to stand in air. In addition, adjusting the type and/or the amount of a dopant makes it possible to control the electrical properties in a flexible manner.

An absorption coefficient of the doped material for light having a wavelength of about 550 nanometers may be $1 \cdot 10^4$ to $1 \cdot 10^2$, $3 \cdot 10^4$ to $7 \cdot 10^3$, or $6 \cdot 10^4$ to $4 \cdot 10^3$. A transmittance of the doped material for light having a wavelength of about 550 nanometers may be 80% to 99.9%, 82% to 99%, or 84% to 98%. The doped material having the foregoing transmittance may have a sheet resistance of about 1 $\Omega$/sq to about 400 $\Omega$/sq, or about 10 $\Omega$/sq to about 300 $\Omega$/sq.

In an embodiment, the doped material comprising the compound represented by Chemical Formula 1 may have a product of an absorption coefficient ($\alpha$) for light having a wavelength of about 550 nm and a resistivity value ($\rho$) thereof of less than or equal to about 50 ohms per square ($\Omega$/sq), for example, less than or equal to about 46 $\Omega$/sq, or less than or equal to about 42 $\Omega$/sq, or about 1 $\Omega$/sq to about 50 $\Omega$/sq, or about 5 $\Omega$/sq to about 46 $\Omega$/sq. However, the product of adoption coefficient and the resistivity may vary with an amount of the dopant.

Herein, the absorption coefficient ($\alpha$) and resistivity ($\rho$) are calculated via a computer simulation. That is, the resistivity ($\rho$) is obtained by calculating the density of states (DOS) and the band structure around the Fermi level from the crystal structure of the corresponding compounds. In addition, the absorption coefficient ($\alpha$) for a certain wavelength is calculated from the dielectric constant of the compound that is obtained by applying the Drude model and considering electron transition due to inter-band transition. As to simulation methodology for providing the absorption coefficient ($\alpha$) and the resistivity ($\rho$), it is possible to further refer to the Vienna Ab-initio Simulation Package (written by Georg Kresse and Jurgen Furthmuller, Institut fur Materialphysik, Universitat Wien, Sensengasse 8, A-1130 Wien, Austria, Aug. 24, 2005, http://cms.mpi.univie.ac.at/VASP or http://www.vasp.at), which is incorporated herein by reference in its entirety. The simulation procedures are summarized in Table 1.

TABLE 1

| Calculation step | Simulation level | Calculation/simulation |
|---|---|---|
| Atom electron structure | DFT | Structure optimization<br>Band structure calculation |
| Electrically conductive characteristics | Semi-classical Boltzmann transport (const. $\tau$) | Intra-band transition<br>$\sigma = (e^2/4\pi^3) \tau \int dk\, v(k)\, v(k)\, (-\partial f/\partial \in) = ne^2\tau/m_{eff} = ne\mu$<br>$\rho = 1/\sigma$ |
| Dielectric characteristics | DFPT + Drude model | Inter-band transition<br>$\in(\omega) = \in_D(\omega) + \in_B(\omega) = \in_1(\omega) + i \in_2(\omega)$ |
| Optical characteristics | Ray optics | $n(\omega) + i\, k(\omega) = \in(\omega)^{1/2}$<br>Absorption coeff. $\alpha = 4\pi k/\lambda$<br>Calculate $\rho\alpha$ |

In Table 1:

DFT is density-functional theory,

DFPT is density-functional perturbation theory,

Drude model is the free electron model for solid, $\sigma$, $\tau$, $m_{eff}$, $\mu$, and $\rho$ are electrical conductivity, relaxation time, effective mass, mobility, and resistivity, respectively, and $\omega$ is the frequency Hereinbelow, the description of Table 1 is explained in further detail.

In order to calculate a quantum mechanical state of a material, the first-principles calculation (a calculation made from a fundamental equation without using extrinsic parameters) based on the density functional theory (DFT) method (a method of solving a quantum mechanical equation by describing the electron distribution using an electron density function instead of a wave function) is performed to calculate the quantum mechanical state of an electron. The VASP (the Vienna Ab initio simulation package code, which is the first principle the DFT code) is used to calculate the electron state. A candidate material group including a two-dimensional electron gas layer is selected from the Inorganic Crystal Structure Database (ICSD). The atomic structure information for the candidate material is input and the energy level of the electrons is calculated by simulation, and for such electrons, an energy density function and a state density function on a k-space of the electrons are calculated.

The electron structure calculated through the DFT computer simulation provides an E-k diagram (the band structure) and DOS (Density of State: electron state density, electron state density function per energy unit) information, making it possible to determine whether the given material is a metallic conductive material ($DOS(E_F) > 0$) or a semiconductor material ($DOS(E_F) = 0$) depending on the presence of the DOS on the maximum energy level ($E_F$) available to the electrons. In order to predict the conductivity (o) of a metallically conducting material, its conductive characteristics are estimated by introducing a semi-classical Boltzmann transport model according to Formula 1. In this case, relaxation time of electrons (T: duration during which an electron can move without collision) is assumed to be constant (see Ashcroft and Mermin, Solid State Physics, Holt, Rinehart and Winston, 1976).

Formula 1

$$\sigma = (e^2/4\pi^3)\tau \int dk\, v(k)\, v(k)\, (-\partial f/\partial E) \qquad \text{Boltzmann-Transport}$$

In Formula 1, $\tau$ is a relaxation time of an electron, k is a state of the electron in the k-space, v(k) is a speed of the electron in the k state, f is the Fermi-Dirac distribution function, and E is energy. In this case, v(k) may be calculated from the E-k diagram, and $\sigma/\tau$ may be obtained from the above equation.

The mechanism for determining the transmittance or absorption of the conductive material may include intraband absorption due to plasma-like oscillation of free electrons and intra-band absorption due to band-to-band transition of bound electrons. The quantum computational simulation process considering each of the mechanisms may be obtained by the process as set forth in Table 2 (see Ashcroft and Mermin, Solid State Physics, Holt, Rinehart and Winston, 1976).

TABLE 2

Simulation table for Optical Properties.

| STEP | Category | Calculation | Results | Method (tool) |
|---|---|---|---|---|
| 1 | Optical simulation | Inter-band transition | $\in B(w) =$<br>$\in B1(w) + i \in B2(w)$ | DFT (VASP) |
| 2 | Optical simulation | Plasma frequency<br>Intra-band transition | $\in D(w) =$<br>$\in D1(w) + i \in D2(w)$ | Boltzmann transport<br>DFT (VASP) or Post-processing |
| 3 | Optical simulation | Total dielectric constant<br>Refractive index | | Post-processing |

TABLE 2-continued

Simulation table for Optical Properties.

| STEP | Category | Calculation | Results | Method (tool) |
|---|---|---|---|---|
| 4 | Optical simulation | Reflectance Absorption coefficient | Plasma freq. Reflectance Absorption co. Transmittance | Post-processing |

Herein, B denotes a band, and D denotes a Drude model.

In this case, the relationships of the dielectric constant ($\epsilon$), the refractive index (n), and the absorption coefficient ($\alpha$) of a solid are shown as follows. For the dielectric constant, both the inter-band transition related portion (E(Band)) and the intra-band transition related portion (E(Drude)) should be considered.

$$\varepsilon(\omega) = \varepsilon_{(Drude)} + \varepsilon_{(Band)} = \varepsilon_1(\omega) + i\varepsilon_2(\omega) \quad \text{dielectric function}$$

$$(n + ik)^2 = \varepsilon(\omega) \quad \text{refraction function}$$

$$\alpha(\omega) = 4\pi k/\lambda \quad \text{absorption coefficient}$$

As set forth in the above conductivity calculation, the interband absorption may be calculated through the band structure as calculated in advance while the intra-band absorption by the free electrons is calculated by the simulation as below through the conductivity and optical coefficient calculation based on the Drude modeling (see Jin-woong Kim, Journal of Applied Physics 110, 083501 (2011), the content of which is hereby incorporated by reference in its entirety).

CGS UNIT $$\sigma(\omega) = \sigma_0/[1 - i\omega\tau] \quad \text{AC conductivity}$$

$$\sigma_0 = ne^2\tau/m \quad \text{DC conductivity}$$

$$\delta(\omega) = 1 + i(4\pi/\omega)\sigma(\omega)$$

$$\omega_p^2\tau = \sigma_0/s_0 \ (si)$$

$$= 4\pi\sigma_0 \ (cgs)$$

$$\varepsilon(\omega) = 1 + i(4\pi(\omega)\sigma_0/[1 - i\omega\tau]$$

$$= 1 - (4\pi\sigma_0/\omega)/[1 + \omega\tau]$$

$$= 1 - (4\pi\sigma_0/\omega)(-i + \omega\tau)/[1 + (\omega\tau)^2]$$

$$= 1 - (\omega_p\tau)^2/[1 + (\omega\tau)^2] +$$

$$i(\omega_p\tau)^2/[\omega\tau(1 + (\omega\tau)^2)]$$

$$\epsilon_1 = 1 - \frac{\omega_p^2\tau^2}{1 + \omega^2\tau^2}$$

$$\epsilon_2 = 1 - \frac{\omega_p^2\tau^2}{\tau\omega(1 + \omega^2\tau^2)}$$

$$n = \frac{1}{\sqrt{2}}\left(\epsilon_1 + (\epsilon_1^2 + \epsilon_2^2)^{1/2}\right)^{1/2}$$

$$k = \frac{1}{\sqrt{2}}\left(-\epsilon_1 + (\epsilon_1^2 + \epsilon_2^2)^{1/2}\right)^{1/2}$$

wherein:
$\omega$ is frequency,
$\omega_p$: plasma frequency and
k is the extinction coefficient.

As set forth in the above, the calculation of the inter-band absorption and the intra-band absorption makes it possible to calculate the dielectric function of the given material, and the optical constants thereof can be simulated therefrom. In the end, the reflectance (R), the absorption coefficient ($\alpha$), and the transmittance (T) of the given material can be calculated therefrom.

The electrical conductivity (simulation at a doping concentration of $10^{21}$ per cubic centimeter ($cm^{-3}$)), Eg (bandgap), absorption coefficient ($\alpha$), conductivity ($\sigma$), and sheet resistance (e.g., which is related to the product of absorption coefficient ($\alpha$) and resistivity ($\rho$)) at 98% of transmittance of the compounds of Chemical Formula 1 by the above methods are provided in the following Table 3.

TABLE 3

Simulation (when $10^{21}$ doping)

| Composition | Eg (eV) | $\alpha$ ($cm^{-1}$) | $\sigma$ (S/cm) | Rs (Ohms/sq) |
|---|---|---|---|---|
| $SnS_2$ | 2.07 | $9.03 \cdot 10^3$ | 20400 | 21.9 |
| $SnSe_2$ | 0.97 | $1.60 \cdot 10^{04}$ | 19200 | 41 |
| GaS | 3.05 | $2.44 \cdot 10^4$ | 29000 | 41.66 |
| GaSe | 1.99 | $1.12 \cdot 10^4$ | 42800 | 12.92 |
| InSe | 1.31 | $8.50 \cdot 10^3$ | 64700 | 6.5 |
| $SiS_2$ | 2.72 | $1.53 \cdot 10^4$ | 43500 | 17.4 |
| $GeS_2$ | 3.42 | $1.12 \cdot 10^4$ | 22600 | 24.49 |
| $GeSe_2$ | 2.43 | $1.32 \cdot 10^4$ | 22600 | 29.02 |
| $Al_2Te_3$ | 2.71 | $2.19 \cdot 10^4$ | 23900 | 45.36 |

The product of resistivity ($\rho$) and absorption coefficient ($\alpha$) may represent the product of sheet resistance ($R_e$) and transmittance (InT) according to the following equation. Accordingly, compounds having a lower value of $\rho*\alpha$ may be advantageous for a material for electrically conductive thin films.

$$e^{-\alpha t} = T \text{ (i.e., } \alpha t = -\ln T)$$

$$R_s = \rho/t$$

$$\therefore \rho*\alpha = Rs*(-\ln T),$$

wherein
$\alpha$: absorption coefficient,
$\rho$: resistivity,
T: transmittance (at $\lambda$=550 nm),
t: thickness, and
Rs: sheet resistance.

In an embodiment, the doped material may have a layered crystal structure. The unit structure layers may be connected by a Van der Waals force in the layered crystal structure, so it is capable of interlayer sliding and may be fabricated to provide nanosheets by mechanical exfoliation or liquid exfoliation, or the like, so as to provide a thin film having excellent flexibility. Accordingly, the conductive thin film according to an embodiment may be for a flexible electronic device.

The conductive thin film according to an embodiment is based on an inorganic material including a metal and a non-metal, and as described above, may provide a relatively high level of electrical conductivity together with a high transparency in a thin thickness. In addition, due to the layered crystal structure of the compound, the electrically conductive thin film including the same may show a high level of flexibility. The electrically conductive thin film may have a thickness of less than or equal to about 100 nm, for example, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 20 nm, and may have a thickness of about 1 nm to about 100 nm, about 2 nm to about 80 nm, or about 4 nm to about 60 nm.

In an embodiment, the electrically conductive thin film may be produced by preparing the compound represented by Chemical Formula 1 in the form of a polycrystalline or monocrystalline bulk material (e.g., sintered body), or a powder prepared from the bulk material; and conducting a doping method such as vapor deposition and the like with the compound according to Chemical Formula 1 to form a conductive thin film (e.g., a transparent conductive layer). Alternatively, the electrically conductive thin film may be obtained by liquid phase exfoliation (LPE) of the bulk material powder of the compound of Chemical Formula 1 to provide nanosheets and forming the obtained nanosheets into a thin film.

The doped material of the compound represented by Chemical Formula 1 may include each element and/or a compound including each element. For example, a starting material for the preparation of the compound of Chemical Formula 1 may be a metal powder including Al, Ga, In, Si, Ge, or Sn. The starting material for the preparation of the compound of Chemical Formula 1 may be selenium powder, sulfur powder, or tellurium powder. For example, the starting material for the preparation of the compound of Chemical Formula 1 may be a selenide, sulfide, or telluride including Al, Ga, In, Si, Ge, or Sn. For example, the starting material for the preparation of the compound of Chemical Formula 1 may be a halide including Al, Ga, In, Si, Ge, or Sn. For example, the starting material for the preparation of the compound of Chemical Formula 1 may be a doping metal element or a compound (e.g., selenide, sulfide, telluride, or halide) including the doping metal.

The polycrystalline bulk material according to Chemical Formula 1 may be prepared from the starting material for the preparation of the compound of Chemical Formula 1 by using, for example, a quartz ampoule method, an arc melting method, and the like.

For example, the quartz ampoule method includes introducing the starting material elements into a quartz tube or an ampoule made of a metal, sealing the same under vacuum, and heating the same to perform a solid-phase reaction or a melting process.

In this case, it may include mixing and pelletizing the starting powders and then heating the obtained pellet, or heating the starting powder mixtures and then pelletizing and sintering the same.

The arc melting method includes introducing a starting material element into a chamber, performing an arc discharge process under an inert gas (e.g., nitrogen, argon, etc.) atmosphere to melt the starting material element, and solidifying the same. The starting material may be a powder or a bulk material (e.g., pellet). If desired, the starting powder may be uniaxially-compressed to provide a bulk material. The arc melting method may include arc melting at least twice while turning the upper surface of the pellet and the lower surface thereof over to uniformly heat the upper and lower surfaces of the pellet. The current intensity applied in the arc melting is not particularly limited, and may be greater than or equal to about 50 amperes (A), for example, greater than or equal to about 200 Å, but is not limited thereto. The current intensity applied on the arc melting may be less than or equal to about 350 Å, for example, less than or equal to about 300 Å, but is not limited thereto.

The obtained polycrystalline bulk material may be subjected to a sintering process to be prepared as a highly densified product. The highly densified material may be used as a specimen for measuring electrical conductivity. Such a densification process may be performed by a hot pressing method, a spark plasma sintering method, a hot forging method, or the like. The hot pressing method includes loading the pulverized compound into a mold having a predetermined shape, and forming the same at a high temperature of, for example, about 300° C. to about 800° C. under a high pressure of, for example, about 30 Pascals (Pa) to about 300 megaPascals (MPa). The spark plasma sintering method includes applying the pulverized compound with a high voltage and/or current under a high pressure, for example, with a current of about 50 Å to about 500 Å under a pressure of about MPa to about 300 MPa to sinter the material within a short period of time. The hot forging method may include compressing and sintering the powder compound at a high temperature of, for example, about 300° C. to about 700° C.

The monocrystalline bulk material may be obtained by providing crystalline ingots or growing single crystals. The crystal ingot may be obtained by heating a congruently melting material at a temperature of higher than the melting point and slowly cooling the same. For example, starting mixtures can be put into a quartz ampoule, the quartz ampoule sealed under vacuum to melt the starting mixture, and then the melted solution slowly cooled to provide a crystalline ingot. The crystal grain size may be controlled by adjusting the cooling speed of the melted mixture. The growth of the monocrystal may be performed by a metal flux method, a Bridgman method, an optical floating zone method, a vapor transport method, or the like. In the metal flux method, a starting material powder is put into a crucible with a flux and treated at a high temperature to grow a crystal under an atmosphere wherein the starting material elements may form a growing crystal at a high temperature. The Bridgman method includes introducing the starting material element into a crucible and heating the same at a high temperature until the starting material element is dissolved at the terminal end of the crucible, and then slowly moving the high temperature zone and locally dissolving the sample to pass the entire sample through the high temperature zone, so as to grow a crystal. The optical floating zone method is a method including forming a starting material element into a rod-shaped seed rod and a feed rod, locally melting the sample at a high temperature by focusing lamp light on the feed rod, and slowly pulling up the melted part to grow a crystal. The vapor transport method includes introducing the starting material element into the bottom part of a quartz tube and heating the starting material element, and maintaining the upper part of quartz tube at a low temperature to perform a solid-phase reaction with a vaporized starting material element at a low temperature and thereby to grow a crystal. The electrical conductivity of the obtained monocrystal material may be measured according to a DC 4-terminal method.

The prepared monocrystalline or polycrystalline bulk material can be pulverized to provide crystal powder. The pulverization may be performed by any suitable method, such as with a ball mill without particular limitation. After the pulverization, a powder having a uniform size may be provided, using, for example, a sieve.

The obtained polycrystalline or monocrystalline bulk material can be used as a target of vapor deposition to provide a thin continuous film (i.e., electrically conductive thin film) including the compound. The vapor deposition may be performed by physical vapor deposition such as thermal evaporation and sputtering, chemical vapor deposition, atomic layer deposition (ALD), or pulsed laser deposition. The deposition may be performed using any suitable apparatus, and may be a commercially available apparatus. The deposition conditions may vary with the type of the compound and the deposition method, but are not particularly limited.

According to another embodiment, the bulk material of the above compound or the powder thereof may be subjected to liquid phase exfoliation (LPE) to be prepared as a plurality of nanosheets, which are then brought into contact with each other so as to provide an electrical connection, providing an electrically conductive thin film.

In the liquid phase exfoliation, the bulk material or the powder thereof may be subjected to ultra-sonication in an appropriate solvent. Examples of the solvent suitable for the liquid phase exfoliation may include, but are not limited to, water, an alcohol (e.g., isopropyl alcohol, ethanol, or methanol), N-methyl pyrrolidone (NMP), hexane, benzene, dichlorobenzene, toluene, chloroform, diethylether, dichloromethane (DCM), tetrahydrofuran (THF), ethyl acetate (EtOAc), acetone, dimethyl formamide (DMF), acetonitrile (MeCN), dimethyl sulfoxide (DMSO), ethylene carbonate, propylene carbonate, γ-butyrolactone, γ-valerolactone, a perfluorinated aromatic solvent (e.g., hexafluorobenzene, octafluorotoluene, pentafluorobenzonitrile, and pentafluoropyridine), or a combination thereof.

The solvent may further include an additive such as a surfactant in order to facilitate the exfoliation and prevent the exfoliated nanosheets from agglomerating. Examples of the surfactant may include sodium dodecyl sulfate (SDS) and sodium dodecylbenzenesulfonate (SDBS).

The ultrasonication may be performed using any suitable ultrasonication device, and the conditions thereof (e.g., ultrasonication time) are not particularly limited, and may be appropriately selected by one of skill in the art without undue experimentation considering a solvent used and a powder concentration in the solvent. For example, the ultrasonication may be performed for greater than or equal to about 1 hour, for example, for about 1 hour to about 100 hours, but is not limited thereto. The powder concentration in the solvent may be greater than or equal to about 0.01 grams per milliliter (g/mL), for example, within a range from about 0.01 g/mL to about 1 gram per liter (g/L), but is not limited thereto.

In order to facilitate the exfoliation, lithium atoms may be intercalated into the compound having an interlayered crystal structure. According to an embodiment, the compound is immersed in an alky lithium compound (e.g., butyllithium) solution in an aliphatic hydrocarbon solvent such as hexane to intercalate lithium atoms into the compound, and the obtained product is subjected to ultrasonication to provide a plurality of nanosheets including the compound. For example, by putting the obtained product in water, water and the intercalated lithium ions may react to generate hydrogen between layers of the crystal structure, so as to accelerate the interlayer separation. The obtained nanosheets can be separated according to an appropriate method (e.g., centrifugation) and washed.

In the electrically conductive thin film including the nanosheets (e.g., nanoflakes), the nanosheets can physically contact one another to provide an electrical connection. When nanosheets are physically connected to provide as thin a film as possible, the obtained film may have further improved transmittance. The obtained film may have coverage of greater than or equal to about 50%, about 50% to about 99%, or about 60% to about 95%. The obtained layer may have very high transmittance (e.g., greater than or equal to about 80%, or greater than or equal to about 85%, or about 80% to about 99%, or about 85% to about 95%) when the thickness is less than or equal to about nm, for example, less than or equal to about 5 nm. The forming a film using nanosheets may be performed according to any suitable method. For example, the film may be formed according to dip coating, spray coating, printing after forming an ink or paste, or the like.

According to an embodiment, the manufactured nanosheets are added to deionized water, and the resulting dispersion is ultrasonicated again. An organic solvent that is not miscible with water (e.g., an aromatic hydrocarbon such as xylene or toluene) can be added to the ultrasonicated dispersion. When the mixture thus obtained is shaken, a thin film including nanosheets is formed at the interface between the water and the organic solvent. When a clean, wetted, and oxygen plasma-treated glass substrate is slightly dipped to the interface and removed, the thin film including nanosheets is disposed on the substrate at the interface. The thickness of the thin film may be selected by selecting a concentration of the nanosheets per area on the surface of the water/organic solvent and a speed and/or angle of the substrate to the interface.

The electrically conductive thin film provides high conductivity, enhanced light transmittance, and improved flexibility, and thus may replace an electrode including a transparent conductive oxide such as ITO, ZnO, and the like and a transparent film including a Ag nanowire.

Another embodiment provides an electronic device including the electrically conductive thin film. The electrically conductive thin film is the same as described above. The electronic device may be, for example, a flat panel display (e.g., an LCD, LED, or OLED display), a touch screen panel, a solar cell, an e-window, a heat mirror, a transparent transistor, or a flexible display, but is not limited thereto.

Figure 4:
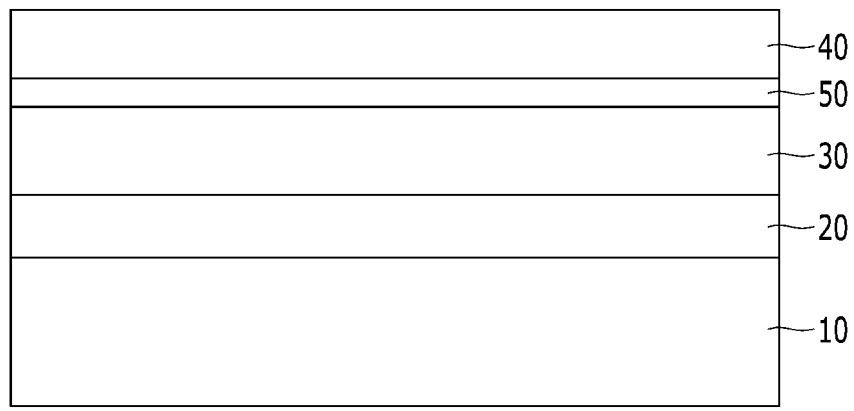
FIG. 4 is a cross-sectional view of an embodiment of an organic light emitting diode device including an electrically conductive thin film.

FIG. 4 is a schematic cross-sectional view of an organic light emitting diode device including the electrically conductive thin film according to one embodiment.

An organic light emitting diode device according to an embodiment includes a substrate 10, a lower electrode 20, an upper electrode 40 facing the lower electrode 20, and an emission layer 30 interposed between the lower electrode 20 and the upper electrode 40.

The substrate 10 may include, for example, an inorganic material such as glass, or an organic material such as polycarbonate, polymethylmethacrylate, polyethylene terephthalate, polyethylene naphthalate, polyamide, polyethersulfone, or a combination thereof, a silicon wafer, and the like.

One of the lower electrode 20 and the upper electrode 40 is a cathode, and the other is an anode. For example, the lower electrode 20 may be an anode, and the upper electrode 40 may be a cathode.

At least one of the lower electrode 20 and the upper electrode 40 is transparent. When the lower electrode 20 is transparent, an organic light emitting diode device may have bottom emission in which light is emitted toward the substrate 10, while when the upper electrode 40 is transparent, the organic light emitting diode device may have top emission in which a light is emitted opposite the substrate 10. In addition, when the lower electrode 20 and upper electrode 40 are both transparent, light may be emitted both toward the substrate 10 and opposite the substrate 10.

The transparent electrode comprises the electrically conductive thin film. The electrically conductive thin film is the same as described above. The electrically conductive thin film may have a high electron density. The electrically conductive thin film may be a suitable substitute for a LiF/Al or MgAg alloy as a single material.

The emission layer 30 may comprise an organic material emitting one light among primary colors such as red, green, blue, and the like, or a mixture of an inorganic material with the organic material, for example, a polyfluorene derivative, a poly(para-phenylenevinylene) derivative, a polyphenylene derivative, a polyfluorene derivative, polyvinylcarbazole, a polythiophene derivative, or a compound prepared by doping these polymer materials with a perylene-based pigment, a coumarin-based pigment, a rothermine-based pigment, rubrene, perylene, 9,10-diphenylanthracene, tetraphenyl butadiene, Nile red, coumarin, quinacridone, and the like. An organic light emitting diode device displays a desirable image by a spatial combination of primary colors emitted by an emission layer therein.

The emission layer 30 may emit white light by combining three primary colors such as red, green, and blue. Specifically, the emission layer 30 may emit white light by combining colors of neighboring sub-pixels or by combining laminated colors in a vertical direction.

An auxiliary layer 50 may be positioned between the emission layer 30 and the upper electrode 40 to improve luminous efficiency. In the FIG. 4, the auxiliary layer 50 is shown only between the emission layer 30 and the upper electrode 40, but is not limited thereto, and the auxiliary layer 50 may instead be positioned between the emission layer 30 and the lower electrode 20, or may be positioned between the emission layer 30 and the upper electrode 40, and between the emission layer 30 and the lower electrode 20.

The auxiliary layer 50 may include an electron transport layer (ETL) and a hole transport layer (HTL) for balancing between electrons and holes, an electron injection layer (EIL) and a hole injection layer (HIL) for reinforcing injection of electrons and holes, and the like. It may include one or more layers selected therefrom.

Figure 5:
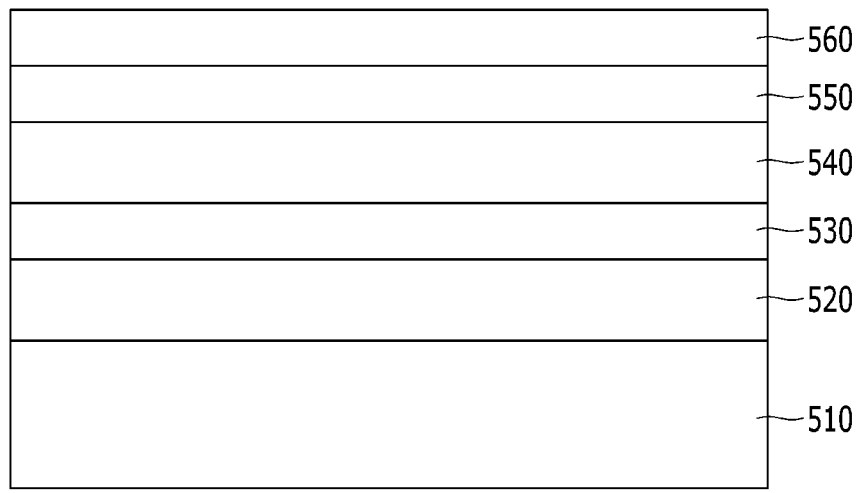
FIG. 5 is a cross-sectional view showing an embodiment of a structure of a touch screen panel including an electrically conductive thin film.

In an exemplary embodiment, the electronic device may be a touch screen panel (TSP). The detailed structure of the touch screen panel is known to those of skill in the art. The schematic structure of the touch screen panel is shown in FIG. 5. Referring to FIG. 5, the touch screen panel may include a first transparent conductive film 520, a first transparent adhesive film 530 (e.g., an optically clear adhesive (OCA)) film, a second transparent conductive film 540, a second transparent adhesive film 550, and a window 560 for a display device, on a panel for a display device 510 (e.g., an LCD panel). The first transparent conductive film and/or the second transparent conductive film may be the electrically conductive thin film.

In addition, an example of applying an electrically conductive thin film according to exemplary embodiments to an organic light emitting diode device or a touch screen panel (e.g., a transparent electrode of TSP) is further illustrated, but an electrically conductive thin film according to exemplary embodiments may be used as an electrode for other electronic devices including a transparent electrode without a particular limit. For example, electrically conductive thin films according to exemplary embodiments may be applied as a pixel electrode and/or a common electrode for a liquid crystal display (LCD), an anode and/or a cathode for an organic light emitting diode device, or a display electrode for a plasma display device.

Hereinafter, the embodiments are illustrated in more detail with reference to examples. These examples, however, are not in any sense to be interpreted as limiting the scope of this disclosure.

Examples

Comparative Example 1: Preparation of $SnSe_2$ Polycrystalline Sintered Body

Tin (Sn) (purity: 99.999%) powder and selenium (Se) powder (purity: 99.999%) are mixed in a mole ratio of 1:2 in a glove box to provide a mixture having a total sample weight of 10 grams (g).

The prepared mixture is put into a quartz glass tube and the tube is sealed under a vacuum condition. Using a solid state synthetic method, the quartz glass tube is introduced into a box furnace and heated at a temperature of 600° C. for 48 hours and then cooled.

The obtained product is pulverized and is subjected to a spark plasma sintering (SPS) by using spark plasma sintering equipment (manufacturer: Fuji Electronic Industrial Co., Ltd., model name: Dr. Sinter) under a pressure of 50 MPa and at 500° C. to provide a polycrystalline sintered body.

Figure 6:
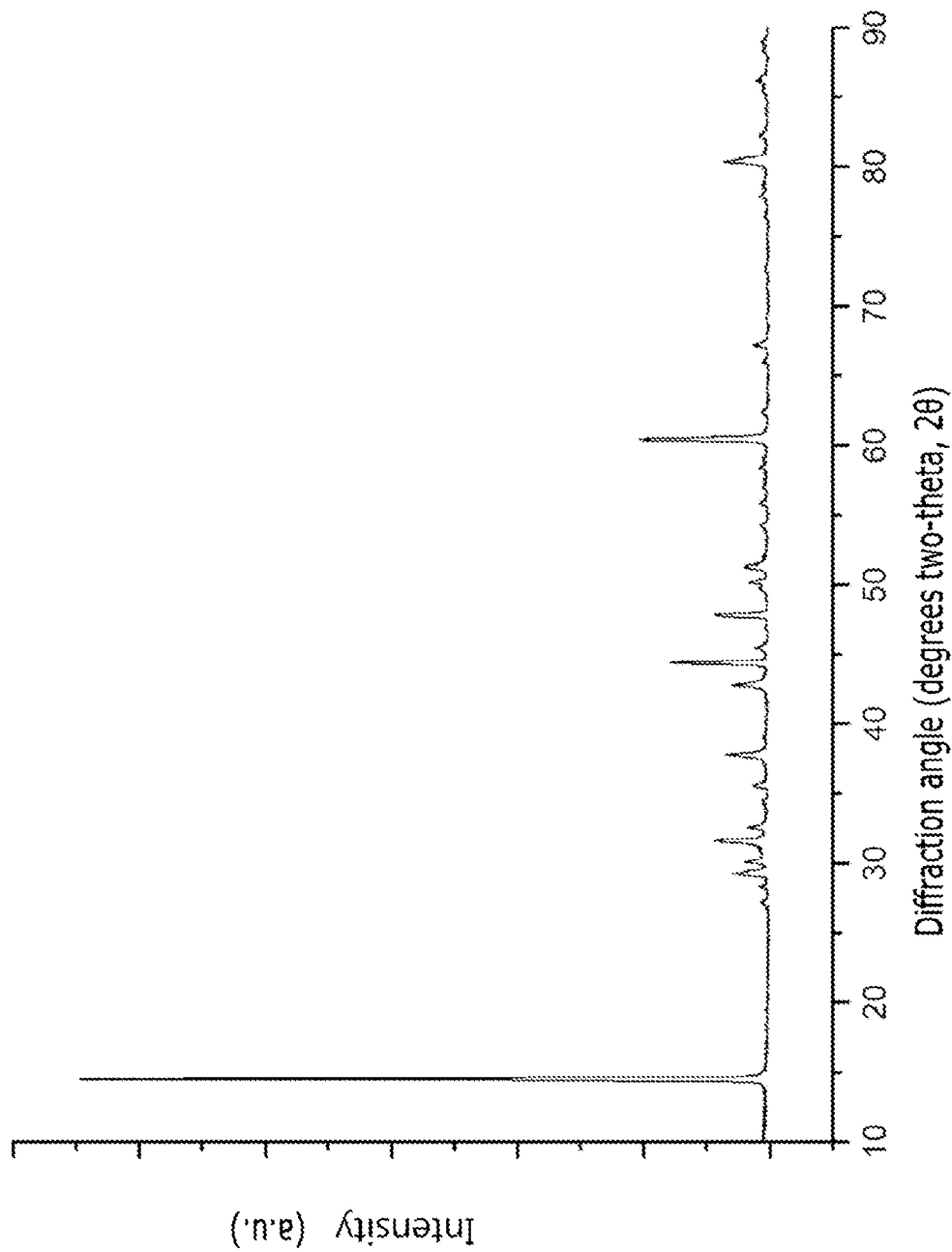
FIG. 6 is a graph of intensity (arbitrary units, a.u.) versus diffraction angle (degrees two-theta, 2θ) which shows an X-ray diffraction spectrum of the polycrystalline sintered body prepared in Comparative Example 1.

The obtained sintered body is analyzed by X-ray diffraction analysis, and the results are shown in FIG. 6.

The electron concentration and the electron mobility of the obtained sintered body are measured by a hole effect measuring device, the electrical conductivity is measured by a 4-probe measuring device, and the results are shown in Table 5.

Comparative Example 2: Preparation of $SnSe_2$ Monocrystalline Sintered Body

The polycrystalline sintered body synthesized according to the method of Comparative Example 1 is sealed under a vacuum condition. The sintered body as sealed is heated at a temperature of a melting point or higher (e.g., 700° C.) for 24 hours and then crystallized by slowly cooling to a temperature of less than or equal to the melting point (e.g., 500° C.) at a rate of 2° C./hour to provide a sintered body of monocrystalline $SnSe_2$. For the prepared sintered body, electron concentration, electron mobility, and electrical conductivity are measured in accordance with the same procedure as in Comparative Example 1, and the results are shown in Table 5.

Example 1: Preparation of Cl Doped $SnSe_2$ Polycrystalline Sintered Body

Tin (Sn) (purity: 99.999%) powder, selenium powder (purity: 99.999%), and tin chloride ($SnCl_2$) (purity: 99.99%) powder are mixed in a mole ratio of Sn:Se:Cl=1:1.84:0.16 in a glove box to provide a mixture (Cl content: 8 atomic %) having a total sample weight of 10 g.

The prepared mixture is introduced into a quartz glass tube and sealed under the vacuum condition. Using a solid-state synthetic method, the quartz glass tube is placed into a box furnace and heated at a temperature of 600° C. for 48 hours, and then cooled.

The obtained product is pulverized and is subjected to a spark plasma sintering (SPS) by using spark plasma sintering equipment (manufacturer: Fuji Electronic Industrial Co., Ltd., model name: Dr. Sinter) under a pressure of 50 MPa and at 500° C. to provide a $SnSe_2$ polycrystalline sintered body doped with Cl.

The obtained sintered body is analyzed by ICP analysis, and the results are shown in Table 4.

TABLE 4

| Composition | Mole ratio | | |
|---|---|---|---|
| | Se | Sn | Cl |
| Comparative Example 1 | 0.996 | 0.502 | 0.000 |
| Example 1 | 0.992 | 0.502 | 0.002 |

The ICP analysis confirms that the doped Cl content is about 0.2 atomic %.

Figure 3:
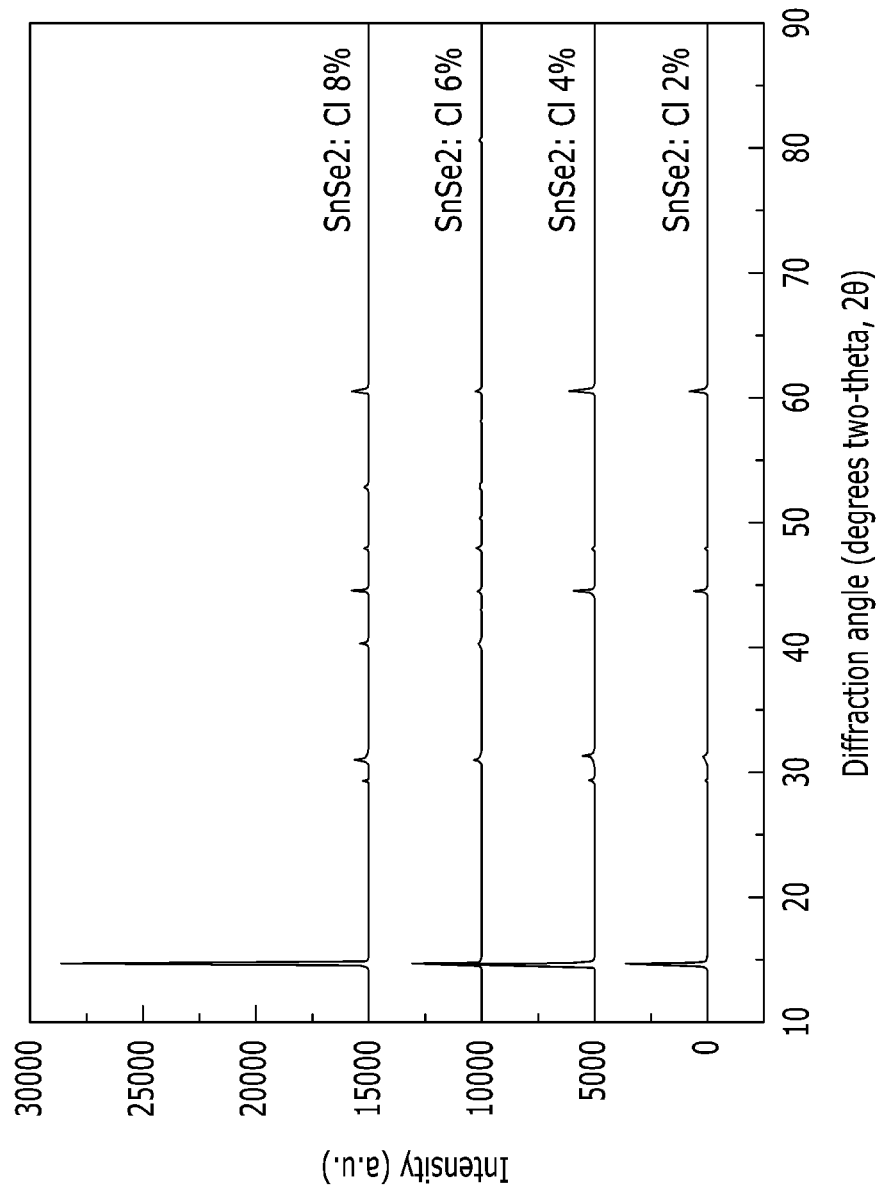
FIG. 3 is a graph of intensity (arbitrary units, a.u.) versus diffraction angle (degrees two-theta, 2θ) which shows an X-ray diffraction spectrum of $Cl^-$ doped $SnSe_2$ synthesized in the Examples.

The obtained sintered body is analyzed by X-ray diffraction analysis, and the results are shown in FIG. 3. From the results shown in FIG. 3, it is confirmed that the obtained doped sintered body has substantially the same crystalline phase as the base material ($SnSe_2$). In other words, the Cl doping does not form a secondary phase, and the doped Cl is substituted into a Se site, and it is confirmed that the Cl doped $SnSe_2$ polycrystalline sintered body maintains the crystalline phase of the $SnSe_2$ polycrystalline sintered body.

The electron concentration, electron mobility, and electrical conductivity in accordance with the same procedure as in Comparative Example 1 of the obtained sintered body is analyzed, and the results are shown in Table 5.

TABLE 5

| | $SnSe_2$ monocrystalline sintered body (Comparative Example 2) | $SnSe_2$ polycrystalline sintered body (Comparative Example 1) | Cl doped $SnSe_2$ polycrystalline sintered body (Example 1) | Doping effect |
|---|---|---|---|---|
| Electrical conductivity (S/cm) | 4 | 1.27 | 389.1 | 306 times |
| Electron concentration ($cm^{-3}$) | $2.5 \cdot 10^{18}$ | $1.11 \cdot 10^{18}$ | $6.03 \cdot 10^{19}$ | 54 times |
| Mobility ($cm^2/Vs$) | 30 | 7.12 | 40.29 | 6 times |
| Carrier type | n - type | n-type | n-type | |

The results of Table 5 confirm that the Cl doped $SnSe_2$ polycrystalline sintered body (Example 1) has significantly improved electrical properties compared to the polycrystalline sintered body according to Comparative Example 1, and even compared to the monocrystalline sintered body of Comparative Example 2. In particular, it is confirmed that the doped sintered body according to Example 1 has improved the electron concentration and electron mobility at the same time. The electron concentration and electron mobility of Example 1 is distinct from other doped semiconductor materials, in which the electron mobility is inversely proportional to the electron concentration. Without wishing to be bound by any particular theory, the results confirm that in the disclosed doped material, movement of free electrons occurs in the two-dimensional space formed by the overlapped 5s orbital due to the electron doping in the compound of Chemical Formula 1.

Example 2: Preparation of Cl Doped $SnSe_2$ Polycrystalline Sintered Body

An $SnSe_2$ polycrystalline sintered body doped with Cl is obtained in accordance with the same procedure as in Example 1, except that Tin (Sn) (purity: 99.999%) powder, selenium powder (purity: 99.999%), and tin chloride ($SnCl_2$) (purity: 99.99%) powder are mixed in a mole ratio of Sn:Se:Cl=1:1.88:0.12 in a glove box to provide a mixture (Cl content: 6 atomic %) having a total sample weight of 10 g. It is confirmed that Cl is doped by measuring the electron concentration of the sintered body.

The obtained sintered body is analyzed by X-ray diffraction analysis, and the results are shown in FIG. 3. From the results shown in FIG. 3, it is confirmed that the obtained doped sintered body has substantially the same crystalline phase as the base material ($SnSe_2$).

Example 3: Preparation of Cl Doped $SnSe_2$ Polycrystalline Sintered Body $SnSe_2$ polycrystalline sintered body doped with Cl is obtained in accordance with the same procedure as in Example 1, except that Tin (Sn) (purity: 99.999%) powder, selenium powder (purity: 99.999%), and tin chloride ($SnCl_2$) (purity: 99.99%) powder are mixed in a mole ratio of Sn:Se:Cl=1:1.92:0.08 in a glove box to provide a mixture (Cl content: 4 atomic %) having a total sample weight of 10 g. The results of measuring the electron concentration of the sintered body confirm that Cl is doped therein.

The obtained sintered body is analyzed by X-ray diffraction analysis, and the results are shown in FIG. 3. The results of FIG. 3 confirm that the doped sintered body thus prepared has substantially the same crystalline phase as the base material ($SnSe_2$).

Example 4: Preparation of Cl Doped $SnSe_2$ Polycrystalline Sintered Body $SnSe_2$ polycrystalline sintered body doped with Cl is obtained in the same manner as in Example 1, except that Tin (Sn) (purity: 99.999%) powder, selenium powder (purity: 99.999%), and tin chloride ($SnCl_2$) (purity: 99.99%) powder are mixed in a mole ratio of Sn:Se:Cl=1:1.96:0.04 in a glove box to provide a mixture (Cl content: 2 atomic %) having a total sample weight of 10 g. It is confirmed that Cl is doped by measuring the electron concentration of sintered body.

The obtained sintered body is analyzed by X-ray diffraction analysis, and the results are shown in FIG. 3. The results of FIG. 3 confirm that the doped sintered body thus prepared has substantially the same crystalline phase as the base material ($SnSe_2$).

Example 5: Preparation of Continuous Thin Film by Deposition

Using the Cl doped $SnSe_2$ polycrystalline sintered body obtained from Example 1 as a target, pulsed laser deposition (PLD) is performed on the $Al_2O_3$ substrate with a Nd/YAG laser under the following conditions:
PLD: PLD 5000 Deposition Systems, PVD Products,
Output: 60 $mJ/cm^2$,
Time: 20 minutes,
Substrate temperature: 600° C., and
Vacuum degree: $2*10^{-6}$ Pa.

The obtained Cl doped $SnSe_2$ deposition film has a thickness of about nm.

Example 6: Preparation of Thin Film Including Cl Doped $SnSe_2$ Nanoflakes

The Cl doped $SnSe_2$ sintered body obtained from Example 1 is pulverized. The pulverized powder is immersed in 1.6 molar (M) butyllithium solution (in hexane) for 48 hours and taken out and cleaned with hexane several times, and then dried under an Ar atmosphere to provide a lithium-intercalated sintered body powder. 15 to 20 grams of lithium-intercalated sintered body powder is input into a vial in a glove box. Subsequently, 5-10 mL of water is added thereto, and the solution is treated by ultrasonication for 1 hour. Layers are separated with hydrogen gas generation to provide nanosheets of a Cl doped $SnSe_2$ sintered body.

The obtained nanosheets are centrifuged and cleaned with water until the precipitates have a pH of 7.

The nanosheet precipitates are put into a vial and added with 3 mL of deionized water and treated by ultrasonication. When adding 2-3 mL of toluene and agitating the vial, a nanosheet thin film is formed on the interface between an aqueous layer and a toluene layer. The glass substrate treated with oxygen plasma is lightly dipped into the interface. The Cl doped $SnSe_2$ film of the interface is thereby spread on the glass substrate.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An electrically conductive thin film comprising:
   a material comprising
      a compound represented by Chemical Formula 1 and having a layered crystal structure:

$$Me_mA_a \qquad \text{Chemical Formula 1}$$

wherein
      Me is Al, Ga, In, Si, Ge, Sn, or a combination thereof, A is S, Se, Te, or a combination thereof, and
      m and a are each independently a number selected so that the compound of Chemical Formula 1 is neutral; and
      a dopant disposed in the compound of Chemical Formula 1, wherein the dopant is a metal dopant that is different from Me and has an oxidation state which is greater than an oxidation state of Me, a non-metal dopant having a greater number of valence electrons than a number of valence electrons of A in Chemical Formula 1, or a combination thereof, and
   wherein the compound of Chemical Formula 1 comprises an overlap between an s orbital of a first Me cation and an s orbital of a second Me cation,
   wherein the film either comprises a plurality of nanosheets comprising the material or is in a form of a continuous deposition film comprising the material.

2. The electrically conductive thin film of claim 1, wherein the metal dopant comprises Ti, Zr, Hf, V, Nb, Ta, Cr, Mo, W, Mn, Fe, Ru, Co, Al, Ga, In, or a combination thereof.

3. The electrically conductive thin film of claim 1, wherein the non-metal dopant is F, Cl, Br, I, or a combination thereof.

4. The electrically conductive thin film of claim 1, wherein the compound of Chemical Formula 1 comprises $SnS_2$, $SnSe_2$, GaS, GaSe, InSe, $SiS_2$, $GeS_2$, $GeSe_2$, $Al_2Te_3$, or a combination thereof.

5. The electrically conductive thin film of claim 1, wherein the content of the metal dopant is less than or equal to about 10 atomic percent, relative to a total content of Me of Chemical Formula 1.

6. The electrically conductive thin film of claim 1, wherein the content of the non-metal dopant is less than or equal to about 10 atomic %, relative to a total content of A of Chemical Formula 1.

7. The electrically conductive thin film of claim 1, wherein the nanosheets contact each other so as to provide an electrical connection.

8. The electrically conductive thin film of claim 1, wherein Me is Al, Si, Ge, Sn, or a combination thereof.

9. The electrically conductive thin film of claim 1, wherein the electrically conductive thin film has a thickness of less than or equal to about 100 nanometers.

10. The electrically conductive thin film of claim 1, wherein the material has an electron mobility of greater than or equal to about 31 $cm^2$/Vs.

11. The electrically conductive thin film of claim 1, wherein the compound is an n-type conductor.

12. The electrically conductive thin film of claim 1, wherein the compound of Chemical Formula 1 is polycrystalline.

13. The electrically conductive thin film of claim 1, wherein the electrically conductive thin film has a sheet resistance of less than or equal to about 400 ohms per square and a transmittance of at least 90% for visible light.

14. The electrically conductive thin film of claim 1, wherein the electrically conductive thin film has an electrical conductivity of 10 Siemens per centimeter to 1000 Siemens per centimeter.

15. The electrically conductive thin film of claim 1, wherein an electrical conductivity of the electrically conductive thin film is at least 10 times greater than an electrical conductivity of the compound of Chemical Formula 1 without the dopant.

16. The electrically conductive thin film of claim 1, wherein the electrically conductive thin film has an electrical conductivity of about 10 Siemens per centimeter to about 500 Siemens per centimeter and a transmittance of at least 98% for visible light.

17. The electrically conductive thin film of claim 1, wherein the electrically conductive thin film has an electron concentration of $10^{19}$ $cm^{-3}$ to $10^{21}$ $cm^{-3}$ and a transmittance of at least 90% for visible light.

18. The electrically conductive thin film of claim 1, wherein the electrically conductive thin film has an electron mobility of at least 2 times an electron mobility of the compound of Chemical Formula 1 without the dopant and a transmittance of at least 98% for visible light.

19. An electronic device comprising the electrically conductive thin film of claim 1.

20. The electronic device of claim 19, wherein the electronic device is a flat panel display, a touch screen panel, a solar cell, an e-window, an electrochromic mirror, a heat mirror, a transparent transistor, or a flexible display.

* * * * *